United States Patent
Takanabe et al.

[11] Patent Number: 5,963,826
[45] Date of Patent: Oct. 5, 1999

[54] METHOD OF FORMING CONTACT HOLE AND MULTILAYERED LINES STRUCTURE

[75] Inventors: Shoichi Takanabe; Masashi Ura, both of Tokyo; Nobuhiro Nakamura, Kumamoto; Osamu Itoh, Kumamoto; Yukio Endoh, Kumamoto, all of Japan

[73] Assignees: Mitsubishi Denki Kabushiki Kaisha, Tokyo; Advanced Display Inc., Kumamoto, both of Japan

[21] Appl. No.: 08/982,079

[22] Filed: Dec. 1, 1997

[30] Foreign Application Priority Data

May 28, 1997 [JP] Japan .................................. 9-138213

[51] Int. Cl.⁶ .......................... H01L 21/44; H01L 21/461
[52] U.S. Cl. ........................... 438/622; 438/618; 438/648
[58] Field of Search ..................... 438/618, 622, 438/648; 257/758, 760, 764, 766

[56] References Cited

U.S. PATENT DOCUMENTS

| | | | |
|---|---|---|---|
| 3,851,161 | 11/1974 | Cummingham et al. | 257/763 |
| 5,236,551 | 8/1993 | Pan | 216/19 |
| 5,427,962 | 6/1995 | Sasaki et al. | 438/159 |
| 5,485,019 | 1/1996 | Yamazaki et al. | 257/57 |
| 5,591,670 | 1/1997 | Park et al. | 438/586 |
| 5,661,344 | 8/1997 | Havemann et al. | 257/758 |

FOREIGN PATENT DOCUMENTS 4-253342  9/1992  Japan .

*Primary Examiner*—Teresa M. Arroyo
*Assistant Examiner*—Maria Guerrero
*Attorney, Agent, or Firm*—Oblon, Spivak, McClelland, Maier & Neustadt, P.C.

[57] ABSTRACT

A method of providing a contact hole including (a) depositing a first conductive film on a substrate and patterning the first conductive film to form a first electrode line, (b) depositing an insulating film on the first electrode line and the substrate, (c) forming a contact hole in the insulating film over a top surface of the first electrode line, and (d) depositing a second conductive film on the insulating film and the contact hole and patterning the second conductive film to form a second electrode line, wherein a surface of the first conductive film is subjected to an oxidizing operation in step (a) so that a contact resistance of the contact hole is lowered.

16 Claims, 5 Drawing Sheets

METHOD OF FORMING CONTACT HOLE AND MULTILAYERED LINES STRUCTURE

BACKGROUND OF THE INVENTION

The present invention relates to a method of forming a contact hole in a thin film transistor or a semiconductor device which are provided by using so-called thin film technology. More particularly, the present invention relates to a method of reducing contact resistance relating to a contact hole for electrical connection between thin film layers in multilayered lines structure such as a thin film transistor device and a semiconductor device.

An active matrix circuit which is provided for a liquid crystal display (LCD) or for an electroluminescent display (ELD) is formed in such a manner that by using a thin film technology such as physical vapor deposition (PVD) method or chemical vapor deposition (CVD) method a semiconductor thin film (hereinafter referred to as a semiconductor film), an insulating thin film (hereinafter referred to as an insulating film), a conductive thin film (hereinafter referred to as a conductive film) and so on are deposited to provide a multi-layer film; the films are patterned by using etching methods and so on; electrical connection between the films is obtained by providing contact holes. These techniques and methods are applied to semiconductor devices, of course.

Such contact holes in active matrix circuits are provided in such a manner that a hole penetrating to a lower film below an insulating film is formed in the insulating film; an upper film is deposited to cover and to fill up the hole; the lower film and the upper film are connected.

The most preferable method for providing a contact hole is adopted in consideration of electrical function required for active matrix circuits as designed and restrictions of production costs and manufacturing instrumentation.

Processes to which the present invention is directed are applied to form active matrix circuits in LCDs, ELDs and so on. Hereinafter, a method of providing contact holes in an example of manufacturing process for LCDs is illustrated.

On a substrate, a first electrode line, an insulating film, a semiconductor film, a second electrode film and so on are formed in the above-mentioned order from the substrate side, to compose a thin film transistor (hereinafter referred to as TFT). A TFT array substrate comprises the substrate, TFTs provided in an array on the substrate, all kinds of lines and all kinds of electrodes. The all kinds of lines are for example control lines, pixel lines and common lines. The control lines are first electrode lines; the pixel lines are second electrode lines; the common lines are storage capacitance lines.

Hereinafter, methods of providing contact holes in an example of manufacturing process for TFT array substrate is illustrated. Explanation for methods of providing contact holes in semiconductor films are omitted since semiconductor films are not affected by problems of providing contact holes.

A first conductive film is deposited on a substrate and patterned to form a first electrode line. That is, a photoresist (hereinafter simply referred to as resist) is coated on a prescribed location for the first conductive film; the resist is exposed and is subjected to post baking; the first conductive film is subjected to wet etching to form a first electrode line. Such first conductive film is made of chrome or molybdenum by use of PVD method. Wet etching is performed by a suitably selected etchant, for example a mixed liquid comprising ammonium cerium (IV) nitrate and perchloric acid keeping temperature at 25° C. Thereafter, the resist is stripped off to be removed; an insulating film and a second conductive film are deposited sequentially on the first electrode line and the substrate except for the portion of the first electrode. The material of the insulating film is silicon nitride deposited by the PECVD technique using a gaseous mixture of $SiH_4$, $NH_3$, $N_2$, $H_2$ and so on. Silicon oxide also can be employed in place of silicon nitride for the insulating film and the film of silicon oxide can be formed by means of CVD method similarly.

Another resist is coated on a prescribed location on the insulating film, and then the resist is exposed and developed; the insulating film is subjected to dry etching to form a contact hole. In dry etching, resources gasses such as $SF_6$, $CF_4$, $CHF_3$, $ClF_3$, CFC (chrolofluorocarbon)-123 or mixture thereof can be used. Dry etching is performed by use of such resources gasses and by keeping a density of radio frequency power (hereinafter simply referred to as RF power density) at approximately 1 $W/cm^2$ and a pressure at approximately 7 Pa. This resist is stripped off to be removed; a second conductive film is formed to cover the contact hole and the insulating film.

The material of the second conductive film is one member selected from a group of chrome, aluminum alloy, molybdenum alloy and indium tin oxide (hereinafter referred to as ITO) i.e. for example ITO by use of PVD method. Thereafter, still another resist is coated on a prescribed location on the second conductive film, and then the resist is exposed and developed; the second conductive film is etched to form a second electrode line. After etching, the resist is removed.

When connecting an upper line (for example, a second electrode line) with a lower line (for example, a first electrode line) through a contact hole of an insulating film, which is formed by conventional method, there is a problem that, in case first couductive film contacts with the second conductive film through the contact hole whose resistivity is high, contact resistivity is high.

In a process of manufacturing TFT array substrate, i.e., in TFT array process, usually six masks are used. When designing structure of layers of a TFT array substrate in such a manner that TFT array substate is manufactured by use of masks reduced from six to five in number, there is a case in which contact resistivity is high. FIG. 5 is a cross sectional view illustrating around a contact hole at the contact. In FIG. 5, a reference numeral 1 denotes a substrate, numeral 3 denotes an insulating film, numeral 11 denotes a common line, numeral 14 denotes a pixel line, numeral 13 denotes a second insulating film, numeral 12 denotes a second conductive film. An ITO film is employed for the second conductive film. As shown in FIG. 5, the ITO film includes two contacts i.e. a contact between the common line 11 and the second conductive film 12 through the insulating contact hole of the film and a contact between the pixel line 14 and the second conductive film 12, for a purpose of connecting the common line 11 with a counter electrode (not shown). When connecting common line 11 with the second conductive film, contact holes of the insulating film are formed at each location of the common line and the second conductive film 12, and then an ITO film is deposited. Thus, the common line 11 is connected with the second conductive film as shown in FIG. 5. In this structure contact resistivity tends to be high. It is preferable that contact resistivity is low taking account of instability in manufacturing.

If a control line serves also as a storage capacitance line which is a common line (Cs on gate type), since an influence on a signal of a control line is large, an increased contact resistance is further inconvenient. Therefore, a contact resistance is required to be as low as possible.

SUMMARY OF THE INVENTION

The object of the present invention is to obtain a method of lowering the contact resistivity to an appropriate value.

According to the present invention there is provided a method of providing a contact hole comprising steps of:

(a) depositing a first conductive film on a substrate and patterning the first conductive film to form a first electrode line, (b) depositing an insulating film on the first electrode line and the substrate except for whole part of a surface of the first electrode line, (c) forming a contact hole of the insulating film, and (d) depositing a second conductive film on the insulating film and patterning the second conductive film to form a second electrode line, wherein in the step (a) a surface of the first conductive film is subjected to oxidizing operation so that a contact resistance of the contact hole is lowered.

Preferably, in the step (a) when the first conductive film is patterned, a surface of the first conductive film is subjected to oxidizing operation before applying a photoresist on the first conductive film, for lowering a contact resistance without influence to other films.

Preferably, the oxidizing operation is ultraviolet light treatment in which an ultraviolet light is irradiated under a condition of oxidizing atmosphere, for oxidizing by easy method.

Preferably, the ultraviolet light treatment is performed wherein a wavelength of the ultraviolet light is in a range of 180 nm to 300 nm;

wherein an output of the ultraviolet light is in a range of 0.05 W/cm$^2$ to 0.5 W/cm$^2$ where a distance from a light source of the ultraviolet light to the surface of the first conductive film is 1 mm;

wherein a duration of irradiating the ultraviolet light is in a range of 1 minute to 5 minutes; and wherein a temperature of an atmosphere when the ultraviolet light is irradiated is in a range of 100° C. to 200° C., for oxidizing by easy method with high throughput.

Preferably, the oxidizing operation is oxygen plasma treatment wherein oxygen plasma is generated and the surface of the first conductive film is exposed to an atmosphere of the oxygen plasma, for oxidizing easily in a short period of time.

Preferably, the oxygen plasma treatment is performed wherein a radio frequency power density generating the oxygen plasma is in a range of 0.01 W/cm$^2$ to 10 W/cm$^2$ where a distance from a plasma discharge source to the surface of the first conductive film is 15 mm;

wherein a pressure of the oxygen plasma is in a range of 100 Pa to 200 Pa;

wherein treatment time of oxygen plasma exposure is in a range of 1 minute to 30 minutes; and wherein a temperature of an atmosphere when the oxygen plasma treatment is performed is in a range of 25° C. to 400° C., for oxidizing easily without modifications of apparatus.

Preferably, the oxidizing operation is wet etching treatment, for oxidizing with better uniformity, low cost and high throughput.

Preferably, the wet etching treatment is performed wherein an etchant for the wet etching treatment is at least one member selected from a group of nitric acid, perchloric acid, hydrogen peroxide, potassium permanganate and ammonium cerium sulfate;

wherein a temperature of the etchant is in a range of 20° C. to 80° C.; and wherein a duration of the wet etching is in a range of 1 minute to 30 minutes, for oxidizing with better uniformity, low cost and high throughput by use of an etchant in low price.

Preferably, in the step (a) the first electrode line is provided by patterning the first conductive film and a surface of the first electrode line is subjected to oxidizing operation, for lowering a contact resistance without influence to other films.

Preferably, the oxidizing operation is ultraviolet light treatment in which an ultraviolet light is irradiated under a condition of oxidizing atmosphere, for oxidizing by easy method.

Preferably, the ultraviolet light treatment is performed wherein a wavelength of the ultraviolet light is in a range of 180 nm to 300 nm;

wherein an output of the ultraviolet light is in a range of 0.05 W/cm$^2$ to 0.5 W/cm$^2$ where a distance from a light source of the ultraviolet light to the surface of the first conductive film is 1 mm;

wherein a duration of irradiating the ultraviolet light is in a range of 1 minute to 5 minutes; and wherein a temperature of an atmosphere when the ultraviolet light is irradiated is in a range of 100° C. to 200° C., for oxidizing by easy method with high throughput.

Preferably, the oxidizing operation is oxygen plasma treatment wherein oxygen plasma is generated and the surface of the first conductive film is exposed to an atmosphere of the oxygen plasma, for oxidizing easily in a short period of time.

Preferably, the oxygen plasma treatment is performed wherein a radio frequency power density generating the oxygen plasma is in a range of 0.01 W/cm$^2$ to 10 W/cm$^2$ where a distance from a plasma discharge source to the surface of the first conductive film is 15 mm;

wherein a pressure of the oxygen plasma is in a range of 100 Pa to 200 Pa;

wherein treatment time of oxygen plasma exposure is in a range of 1 minute to 30 minutes; and a temperature of an atmosphere when the oxygen plasma treatment is performed is in a range of 25° C. to 400° C., for oxidizing in a short time without modifications of apparatus.

Preferably, the oxidizing operation is wet etching treatment, for oxidizing with better uniformity, low cost and high throughput.

Preferably, the wet etching treatment is performed wherein an etchant for the wet etching treatment is at least one member selected from a group of nitric acid, perchloric acid, hydrogen peroxide, potassium permanganate and ammonium cerium sulfate;

wherein a temperature of the etchant is in a range of 20° C. to 80° C.; and wherein a duration of the wet etching is in a range of 1 minute to 30 minutes, for oxidizing with better uniformity, low cost an high throughput by use of an etchant in low price.

Preferably, the first electrode line is made of one member selected from a group of chrominum and molybdenum;

wherein a material of the insulating film is one member selected from a group of silicon nitride and silicon oxide; and wherein a material of the second electrode line is one member selected from a group of chrome, aluminum alloy, molybdenum alloy and indium tin oxide, for wide applicability for devices such as LCDs or semiconductor devices.

DETAILED DESCRIPTION

Figure 1A:
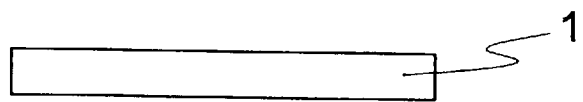
FIGS. 1(a) through 1(d) are sectional views illustrating in order of processes a method of forming a contact hole according to one embodiment of the present invention.
Figure 1B:
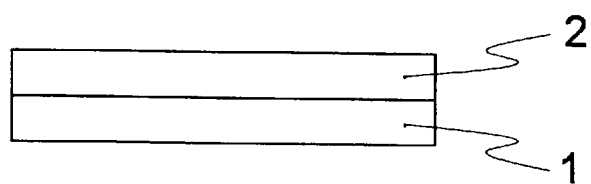

Hereinafter, embodiments of the present invention are explained in detail referring to drawings.

EMBODIMENT 1

A method of forming a contact hole in multilayered lines structure according to this invention obtains low contact resistivity by performing an oxidizing operation of the surface of a conductive film. In this embodiment, an ultraviolet light treatment (hereinafter simply referred to as UV treatment) is conducted as a concrete means of the oxidizing operation with respect to the conductive film, so as to conduct an oxidizing operation under the oxidizing atmosphere by ozone to be generated from the atmosphere by the UV irradiation. The oxidizing operation by the UV irradiation is called a UV treatment. A method of conducting this UV treatment will now be described.

FIGS. 1(a) to 1(d) and FIGS. 2(a) to 2(c) indicate a sectional illustrating view showing, in a step order, a method of forming a contact hole in multilayered lines structure according to one embodiment of this invention. Referring to FIGS. 1(a) to 1(d) and FIGS. 2(a) to 2(c), reference numeral 1 denotes a substrate and reference numeral 2 denotes a first conductive film. Reference numeral 2a denotes a first electrode line, reference numeral 3 denotes an insulating film, reference numeral 4 denotes a contact hole, reference numeral 5 denotes a second conductive film and reference numeral 6 denotes an oxide layer. Reference A indicates a UV treatment for irradiating the first conductive film with the UV light. The second conductive film 5 is patterned to form a second electrode line.

Figure 2A:
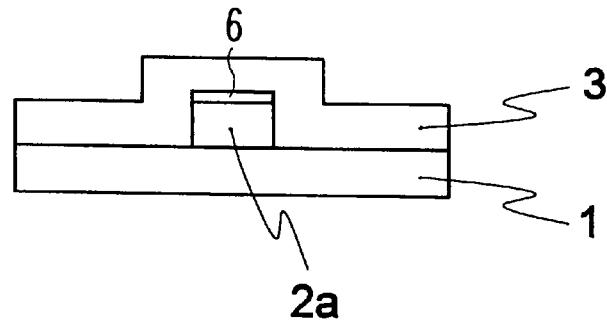
FIGS. 2(a) through 2(c) are sectional views illustrating in order of processes a method of forming a contact hole according to one embodiment of the present invention.
Figure 2B:
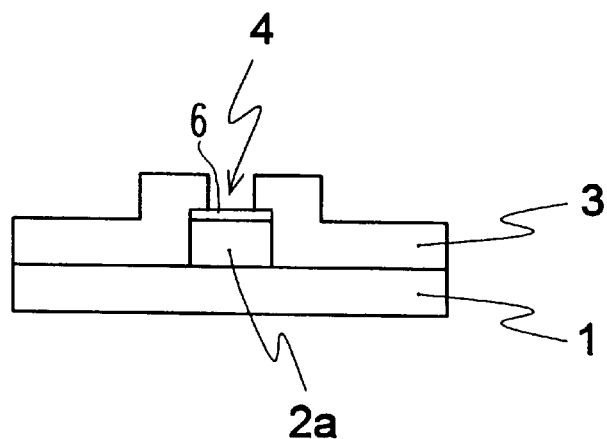
Figure 2C:
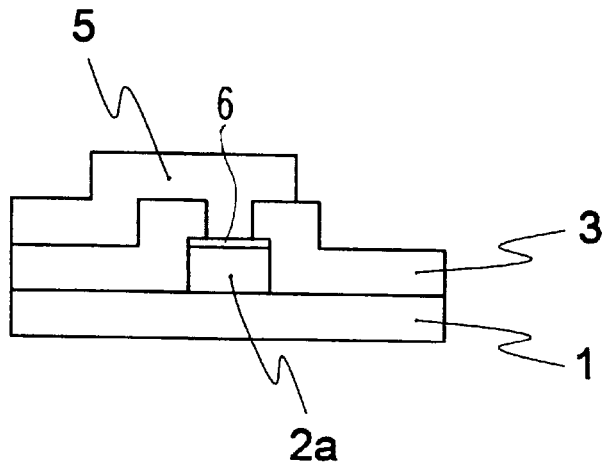

As shown in FIG. 2(c), a contact hole according to this invention is composed of the substrate 1, the first electrode line 2a formed on the substrate 1, the insulating film 3 formed by covering the substrate 1 and the first electrode line 2a, and the second conductive film 5 formed by covering the insulating film 3. The contact hole 4 is formed in an insulating film 3 with a second conductive film connected with the first electrode line 2a.

A method of manufacturing a contact hole according to this invention will now be described.

As a first step, the first conductive film 2 is deposited, and patterned to form the first electrode line 2a. The substrate 1, made of glass or the like, is composed of approximately 370 mm×470 mm in size and approximately 0.7 mm in thickness (refer to FIG. 1(a)). The first conductive film 2 is deposited on this substrate 1 by a PVD method. The conductive film 2 composed of chrome or molybdenum is deposited approximately 400 Å thick (refer to FIG. 1(b)). Then, in order to make the first conductive film oxidized with oxide layer 6, the first conductive film is irradiated by UV light. First, the substrate is heated for easier oxidation. A UV light of 180 nm or more through 300 nm or lower in wavelength is used. When the distance from a light source of the UV light to the surface of the first conductive film is 1 mm, this surface is irradiated with the UV light under conditions where the output of the UV light is 0.05 W/cm$^2$ or more through 0.5 W/cm$^2$ or lower and a duration of irradiating UV light is 1 minute or more through 5 minutes or lower. A reason why the wavelength of the UV light is limited to 180 nm or more through 300 nm or lower is that ozone is likely to be most produced, and the oxidizing atmosphere can be easily obtained. In this range, ozone can be produced with better efficiency. Most preferably, 185 nm or more through 250 nm or lower are desirable due to decomposition efficiency. When a distance to the surface of the first conductive film is made 1 mm, the output of the UV light is limited to 0.05 W/cm$^2$ or more to have better decomposition efficiency of oxygen. A reason why the wavelength is limited to 0.5 W/cm$^2$ or lower is to have lower power consumption. In this range, the decomposition efficiency of oxygen is better, with an effect that oxidizing operation can be conducted with lower power consumption. More preferably, 0.1 W/cm$^2$ or more through 0.3 W/cm$^2$ or lower is desirable because of higher decomposition efficiency of oxygen. Thus, in this range, there is an effect in that the oxidizing operation can be conducted with high throughput. In order to promote the oxidation of the surface of the conductive film, the duration of irradiating the UV light is limited to 1 minute or more. In order to have a higher throughput, the duration is limited to 5 minutes or lower. In order to increase the reaction of the conductive film with oxygen on the surface of the conductive film, the temperature of the atmosphere produced when the UV light is irradiated is limited to 100° C. or more. A reason why the temperature is limited to 200° C. or a lower is to have a higher throughput and have a limit of the temperature which can be achieved easily by a deposition apparatus. Thus, there is an effect where an oxidizing operation can be conducted at a comparatively low temperature during a TFT array process. More preferably, 150° C. is preferable because of a reason of surface oxidation and high throughput.

Figure 1C:
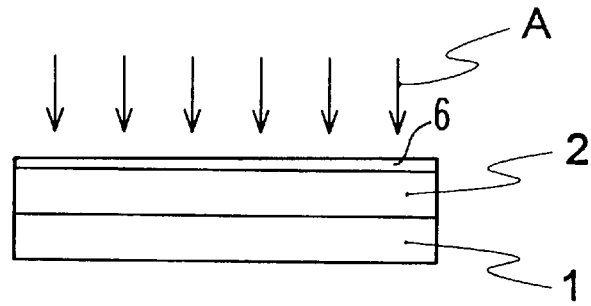
Figure 1D:
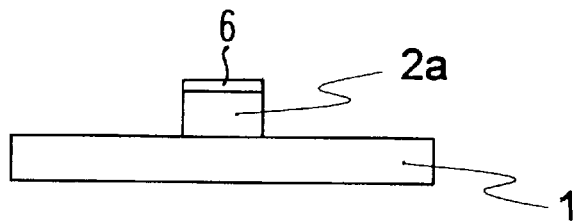

By the UV treatment of a surface of the first conductive film 2 in this manner, an oxide layer 6 with the low resistivity becomes to be formed as the surface layer of the first conductive film (refer to FIG. 1(c)).

The UV processed first conductive film 2 is patterned to form a first electrode line 2a. Namely, by a photolithography process, a resist is coated on a prescribed location of the first conductive film, is exposed and further, is subjected to post baking. Then, the first conductive film is etched to form a first electrode line 2a. An etching treatment is conducted by a wet etching treatment at approximately 25° C. by using mixed liquid, for example, of second ammonium cerium nitrate (ammonium cerium (IV) nitride) and perchloric acid. Then, the resist is removed (refer to FIG. 1(d)).

As a second step, a step of depositing an insulating film will now be described. Namely, an insulating film 3 is deposited to approximately 4000 Å thick by covering the first electrode line 2a and the substrate 1. A material to be used as an insulating film 3 is silicon nitride or silicon oxide similar to that used conventionally. The method of depositing the insulating film is also the same CVD method as that used conventionally (refer to FIG. 2(a)).

Furthermore, a contact hole of an insulating film is formed as a third step. A method of forming a contact hole of an insulating film is the same as before. The contact hole is covered with a resist (not shown) on a prescribed location on the insulating film 3 and is exposed. After the post baking treatment is conducted, the size of approximately 30 μm is formed by a dry etching operation. After the dry etching operation, the resist is removed (refer to FIG. 2(b)).

As a fourth step, a second conductive film 5 is deposited to 1000 Å over an insulating film 3 and a contact hole 4. A material to be used as the second conductive film 5 is chrome, aluminum alloy, molybdenum alloy or ITO. A method of depositing a second conductive film is a PVD method. Both a material and a depositing method are the same as before (refer to FIG. 2(c)).

After a second conductive film made of, for example, ITO or the like is deposited over a contact hole 4 and an insulating film 3, a second electrode line is patterned.

An oxide layer 6 with the low resistivity is formed as a surface layer of a first electrode line by conducting the UV treatment in this manner, an oxidizing operation can be conducted by a simple method, thus achieving an effect of obtaining the low contact resistivity.

The contact resistance of the contact of the contact hole according to this embodiment is measured with a measured voltage 0.1 V with respect to a contact hole of a square of 35 μm in length of one side. As shown in Table 1, the contact resistance of the TFT according to this invention for which the UV treatment is performed is 24.5 Ω. The contact resistance of the conventional TFT for which the UV processing has not been conducted is 31.2 Ω.

TABLE 1

Measured Result of Embodiment 1

|  | UV Treatment Conducted | UV Treatment Not Conducted |
| --- | --- | --- |
| Contact Resistance (Ω) | 24.5 | 31.2 |

Conditions of oxidizing the surface of the conductive film and conditions of a material used for electrode lines, which are explained in this embodiment can be applied even to manufacturing an active matrix circuit to be used in, for example, LCD, ELD or the like, and to forming contact hole in manufacturing of various circuits of a semiconductor device.

EMBODIMENT 2

In this embodiment, a method of generating oxygen plasma as a concrete means of oxidation with respect to a conductive film, exposing the surface of the conductive film to oxygen plasma atmosphere, and conducting oxygen plasma processing (oxygen plasma treatment) for conducting an oxidizing operation will be described.

Up to the depositing a first conductive film on a substrate 1 is the same as that of the embodiment 1. Then, the surface of the first conductive film is exposed by oxygen plasma. In this embodiment, to generate oxygen plasma, oxygen plasma is caused by a plasma CVD apparatus and the surface of the first conductive film 2 is exposed to the oxygen plasma, so as to conduct oxygen plasma treatment.

One example of the oxygen plasma generating conditions at this time is shown. Assume that distance to the surface of the first conductive film from a discharging source for generating oxygen plasma is 15 mm.
Oxygen gas flow: 500 sccm
RF power: 1000 W
RF power density: 0.37 W/cm$^2$
Pressure: 200 Pa
Temperature: 25° C.
Treatment time: 2 minutes Conditions for processing oxygen plasma in this embodiment in this manner are that the distance from the discharge source of high frequency discharging (RF discharging) for generating oxygen plasma to the surface of the first conductive film is 15 mm the power density of the output (RF power) of the RF discharge for generating oxygen plasma is made 0.01 W/cm$^2$ or more through 10 W/cm$^2$ or lower, the pressure of the oxygen plasma is made 100 Pa or more through 200 Pa or lower, and the treatment time is 1 minute or more through 30 minutes or lower and the atmosphere temperature is 25° C. or more through 400° C. or lower. A reason why RF power density for generating oxygen plasma is limited to 0.01 W/cm$^2$ or more is because oxygen gas does not generate oxygen plasma in the RF power density or lower. A reason why the RF power density is limited to 10 W/cm$^2$ or lower is because it is not achieved further easily by a normal apparatus. Namely, in this range, there is an effect that cost does not rise due to modification or the like in apparatus and oxygen plasma can be achieved easily. More preferably, the power density becomes 0.1 W/cm$^2$ or more because of plasma efficiency of oxygen gas, and becomes several wattages or lower because of inhibiting secondary decomposition. A reason why a pressure of the oxygen plasma is limited to 100 Pa or more is because the efficiency of oxidation of the surface of the first conductive film is better. A reason why it is limited to 200 Pa or lower is because the pressure is limited which can be easily achieved by a deposition apparatus. In this range, there is an effect that an oxidizing operation can be easily conducted with efficiency in a normal apparatus. A reason why the treatment time is limited to 1 minute or more is because the surface of the first conductive film is oxidized without fail. A reason why it is limited to 30 minutes or lower is because the throughput is raised. In this range, there is an effect that the surface can be oxidized without fail and the high throughput can be obtained. More preferably the treatment time is limited to 5 minutes or more through 15 minutes or lower because the oxidization of the surface of the first conductive film is obtained more reliably and the throughput is raised. A reason why the temperature of atmosphere when the oxygen plasma treatment is conducted is limited to 25° C. or more is because the oxidization of the surface of the first conductive film is promoted, and a reason why it is limited to 400° C. or lower is because it can be achieved easily by a normal apparatus. In this range, there is an effect that the oxidizing operation of the surface can be conducted easily with efficiency by a normal apparatus. More preferably, since the throughput can be raised, a temperature which is almost the same as that of the temperature of forming insulating film is desirable. As the oxidizing operation can be conducted by a plasma treatment in this manner, the reaction on the surface with oxygen becomes larger and the oxidization is promoted so that an oxidizing operation can be conducted in a short time.

By conducting an oxygen plasma treatment of the surface of the first conductive film 2 as described above, an oxide layer with the low resistivity becomes to be formed as a surface layer of the first electrode line 2a, so as to obtain the lower contact resistivity.

Although a plasma CVD apparatus is used as an apparatus for generating oxygen plasma in this embodiment, in addition, a plasma asher, a dry etching apparatus or the like, or an apparatus capable of generating oxygen plasma can be used preferably.

Even when a plasma asher or a dry etching apparatus is used, conditions for generating oxygen plasma and conducting an oxygen plasma processing operation are processed as in a plasma CVD apparatus, so as to obtain the same effect.

For example, one example of oxygen plasma generating conditions using a plasma asher is shown.

Oxygen gas flow: 450 sccm
RF power: 250 W
RF power density: 0.09 W/cm$^2$
Pressure: 150 Pa
Temperature: 120° C.

A first electrode line is formed by patterning a first conductive film 2 for which oxygen plasma treatment was performed in this manner. The subsequent steps are the same as those of the embodiment 1.

By oxygen plasma treatment of the surface of the first conductive film 2 as described above, a layer 6 of oxide lower in resistance value as a surface layer of the first electrode line 2a exists, so as to obtain low contact resistivity.

Conditions for oxidizing the conductive film surface, and conditions for a material of an electrode line to be used, explained in this embodiment, are applicable even to the formation of a contact hole in manufacturing an active matrix circuit to be used in, for example, LCD, ELD or the like or various types of circuits of the other semiconductor apparatus.

EMBODIMENT 3

In this embodiment, a method of oxidizing by a wet etching treatment as a concrete means of an oxidizing operation with respect to a conductive film will be described.

Up to depositing of the first conductive film on the substrate 1 is the same as that of the embodiment 1. Then, a substrate is dipped in etchant so that the surface of the first conductive film is etched by wet etching and is oxidized in the etchant.

At least one member of etchant selected from a group comprising nitric acid, perchloric acid, hydrogen peroxide, potassium permanganate and ammonium cerium sulfate or mixture of them can be used as etchant. A processing temperature of the wet etching is 20° C. or more through 80° C. or lower. The duration of the wet etching is 1 minute or more through 30 minutes or lower.

At this time, an effect of oxidizing the surface of the conductive film with etchant, easily available with low price, of at least one type selected from nitric acid, perchloric acid, hydrogen peroxide, potassium permanganate and cerium ammonium sulfate as etchant. A reason why the processing temperature is limited to 20° C. or more is because the etching operation is promoted. A reason why the processing temperature is limited to 80° C. or lower is that the progressing of the etching treatment is easy to control. Thus, in this range, the controlling property of the etching operation can be oxidized well. A reason why the duration of the wet etching is limited to 1 minute or more is because the oxidation effect of the surface of the conductive film is obtained. A reason why the duration of the wet etching is limited to 30 minutes or lower is because a throughput is raised. Thus, in this range, the throughput can be increased. In the oxidizing operation by the wet etching treatment, there is provided an effect that better uniformity of the oxidizing operation in a surface can be provided and the throughput can be enlarged.

The subsequent steps for forming a first electrode line 2a by patterning the first conductive film 2 etched by wet etching in this manner are the same as those of the embodiment 1.

An oxide layer 6 with the low resistivity the surface layer of the first electrode line 2a becomes to be formed by the wet etching of the surface of the first conductive film 2, so as to obtain the low contact resistivity.

Conditions of oxidizing the surface of the conductive film and conditions of a material of the electrode line to be used, explained in this embodiment can be applied even to forming a contact hole in the manufacturing of an active matrix circuit to be used in, for example, LCD, ELD and so on or of the various types of circuits of the semiconductor device.

EMBODIMENT 4

Although an oxidizing operation is treated before coating resist after the first conductive film is deposited in the embodiments 1 through 3, an oxidizing operation can be conducted after the first electrode line 2a is formed by the patterning of the first conductive film 2. In this embodiment as a means of conducting the oxidizing operation of this case, an oxidizing operation of the surface of a first electrode line can be conducted by a UV treatment similar to that of this embodiment.

FIGS. 3(a) to 3(d) and FIGS. 4(a) to 4(c) indicate sectional illustrating views showing, in step order, a method of forming a contact hole in multilayered lines structure according to the embodiment of this invention. In FIGS. 3(a) to 3(d) and FIGS. 4(a) to 4(c), the same reference numerals are give to the same portions as those of FIGS. 1(a) to 1(d) and FIGS. 2(a) to 2(c) are given, and reference numeral A indicates the UV processing. In this embodiment, a first electrode line 2a is formed by patterning a first conductive film 2. Then, the UV light is irradiated upon the surface of the first electrode line 2a to conduct a UV treatment, for oxidizing operation, of this surface, so as to form a layer 6 of an oxide low in resistance value as the surface layer of the first electrode line 2a This embodiment is the same as the embodiment 1 except that the UV treatment is conducted after the forming of the first electrode line 2a by patterning the first conductive film 2.

Figure 3A:
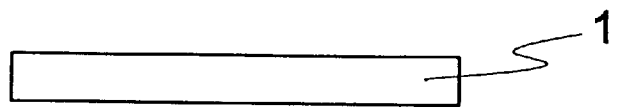
FIGS. 3(a) through 3(d) are sectional views illustrating in order of processes a method of forming a contact hole according to another embodiment of the present invention.
Figure 3B:
Figure 3C:
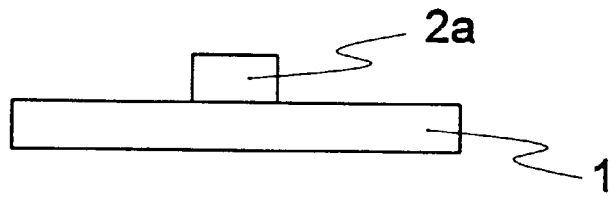
Figure 3D:
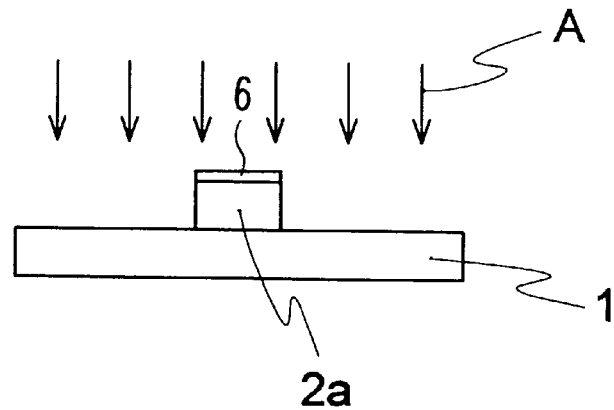
Figure 4A:
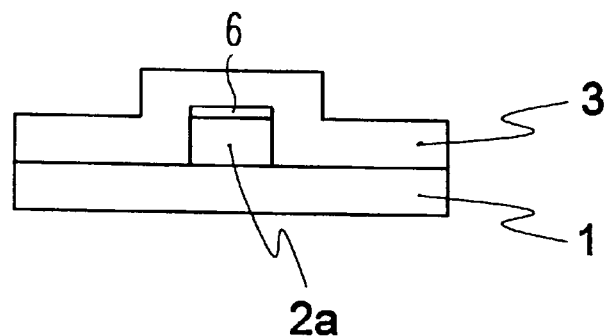
FIGS. 4(a) through 4(c) are sectional views illustrating a method of forming a contact hole according to another embodiment of the present invention.
Figure 4B:
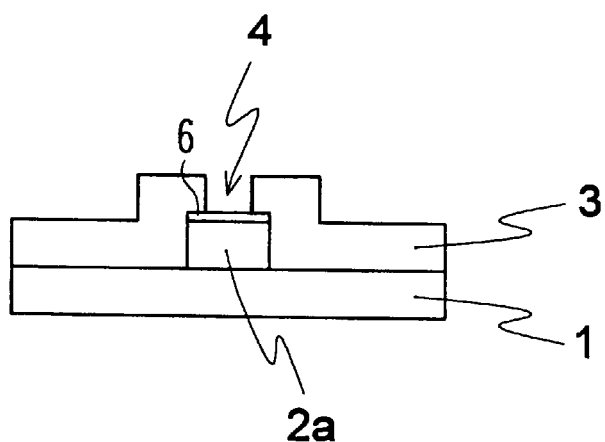
Figure 4C:
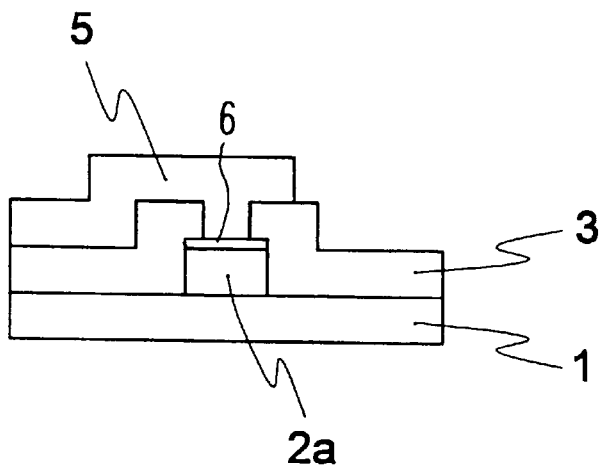
Figure 5:
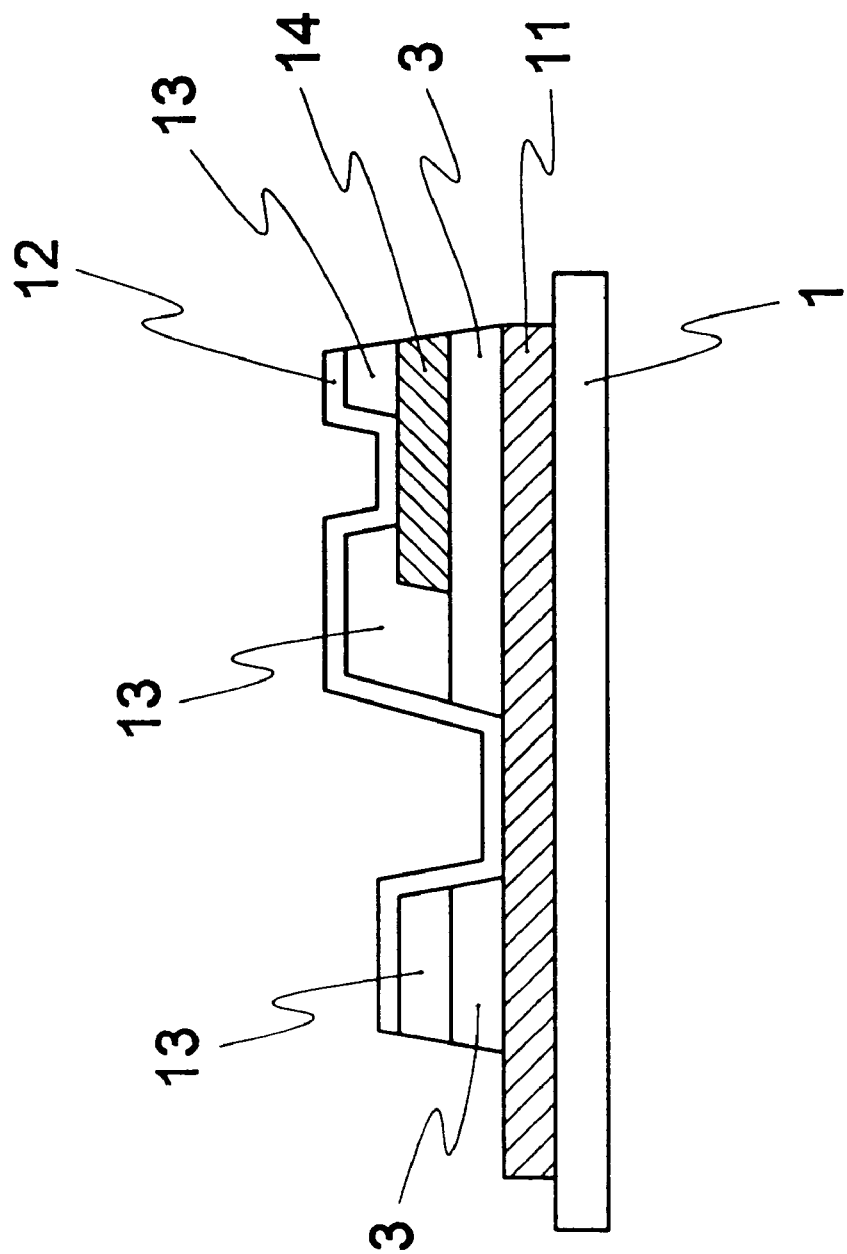
FIG. 5 is a sectional structural view of a contact portion illustrating a case when contact resistivity is high.

Namely, a first conductive film is deposited (refer to FIG. 3(b)) on the substrate 1; the first conductive film is patterned; the first electrode line is formed (refer to FIG. 3(c)); and then the surface of the electrode line 2a is irradiated with UV light under the oxidizing atmosphere, so as to conduct an oxidizing operation. At this time, the oxidizing operation of the surface of the first electrode line 2a is conducted, as those of the embodiment 1, in the respective ranges of conditions such as UV light wavelength, output, a duration of irradiating UV light, atmosphere temperature and so on. The oxide layer 6 with the low resistivity becomes to be formed as the surface layer of the first electrode line by the UV treatment of the surface of the first electrode line 2a in this manner (refer to FIG. 3(d)). After this operation, the insulating film 3 is formed (FIG. 4(a)) in a manner similar to that of the embodiment 1, and the contact hole of the insulating film 3, 4 is formed (refer to FIG. 4(*b*)), so as to form the second conductive film (refer to FIG. 4(*c*)).

In this manner, the low contact resistivity is obtained by forming the oxide layer 6 with the low resistivity as the surface layer of the first electrode line.

As in this embodiment, a first conductive film is patterned and the first electrode line 2*a* is formed. Then, the same effect as that of the embodiment 1 is obtained by UV treatment.

Conditions of oxidizing the surface of the conductive film and the conditions of a material of the electrode line to be used, explained in this embodiment can be applied even to the forming the contact hole in manufacturing of an active matrix circuit to be used in, for example, LCD, ELD and so on or of the various types of circuits of the semiconductor device.

EMBODIMENT 5

A first conductive line is formed by patterning the first conductive film in this embodiment. Then, a method of conducting an oxygen plasma treatment is described as a method of oxidizing the surface. The surface of the first electrode line is oxidized by oxygen plasma exposure as in the embodiment 2 as a means of the oxidizing operation in this case. An oxide layer 6 with the low resistivity is formed as a surface layer of the first electrode line 2*a*.

Namely, a step of forming a first line 2*a* by patterning the first conductive film 2 is the same as that of the embodiment 4. Then, the surface of the first electrode line is subjected to oxygen plasma as in the embodiment 2. As an apparatus for generating oxygen plasma can be used preferably a plasma CVD apparatus, a plasma asher, a dry etching apparatus or the like or an apparatus for generating oxygen plasma. The surface of the first electrode line is oxidized, as in the embodiment 2, in the respective ranges of conditions of oxygen plasma RF power density, pressure, treatment time and atmosphere temperature at this time. As in the embodiment, the first conductive film is patterned and the first electrode line 2*a* is formed. Then, the same effect as that of the embodiment 2 can be obtained by conducting the oxygen plasma operation.

After this, an insulating film 3 is formed as in the embodiment 1, and a contact hole 4 of the insulating film 3 is formed, so as to form a second conductive film.

For example, in the embodiment where the surface of the first electrode line 2*a* has been subjected to oxygen plasma by using a plasma asher, the contact resistance according to this embodiment is measured with a measured voltage of 0.1 V with respect to a square contact hole of 35 μm in the length of one side. As shown in Table 2, the contact resistance of the contact hole according to this invention for which the oxygen plasma treatment has been conducted is 23.4 Ω, while the contact resistance of the conventional contact hole where the oxygen plasma treatment is not conducted is 27.8 Ω.

TABLE 2

Measured Result of Embodiment 5

|  | Plasma Treatment Conducted | Plasma Treatment Not Conducted |
|---|---|---|
| Contact Resistance (Ω) | 23.4 | 27.8 |

EMBODIMENT 6

A first conductive line is formed by patterning the first conductive film in this embodiment. Then, a method of conducting a wet etching treatment is described as a method of oxidizing the surface. An oxidizing operation of the surface of the first electrode line is conducted by the wet etching treatment as in the embodiment 2 as a means of the oxidizing operation in this case. An oxide layer 6 with the low resistivity is formed as a surface layer of the first electrode line 2*a*.

Namely, a step of forming up to a first line 2*a* by patterning the first conductive film 2 is the same as that of the embodiment 4. Then, the surface of the first electrode line is etched by wet etching as in the embodiment 3.

The surface of the first electrode line 2*a* is oxidized, as in the embodiment 3, with the respective ranges of the conditions of etchant type, etchant temperature, a duration of the wet etching or the like. As in the embodiment, the first conductive film is patterned and the first electrode line 2*a* is formed. Then, an effect as that of the embodiment 3 can be obtained by the wet etching treatment.

After that, an insulating film 3 is formed as in the embodiment 1, and a contact hole 4 is formed in the insulating film 3, so as to form a second conductive film Conditions of oxidizing the surface of the conductive film and the conditions of a material of the electrode line to be used, explained in this embodiment can be applied even to the forming the contact hole in manufacturing an active matrix circuit to be used in, for example, LCD, ELD and so on or various types of circuits of the semiconductor devices.

A method of forming a contact hole according to this invention comprises a first step (a) of depositing a first conductive film on a substrate, and patterning the first conductive film, so as to form a first electrode line, a second step (b) of depositing an insulating film on the first electrode line and the substrate except for a portion, a step (c) of forming a contact hole of the insulating film, and a step (d) of depositing a second conductive film on the insulating film, and patterning the second conductive film, to form the second electrode line. The surface of the first conductive film is oxidized, thus resulting in an effect of obtaining the low contact resistivity through the hole.

In the first step (a), before the resist is applied or after the patterning operation is conducted, the surface of the first conductive film is oxidized. Thus, an effect can be obtained of conducting an oxidizing operation without influencing upon other insulating films or the like, so as to obtain the low contact resistivity through the hole.

Since an oxidizing operation is conducted by the UV treatment, with an effect that the surface of the conductive film can be oxidized.

Since a method of forming other contact hole according to this invention is oxidized by a plasma treatment, a reaction between the surface with oxygen on the surface becomes stronger and the oxidization is promoted, with an effect that an oxidizing operation can be conducted in a short duration.

A method of forming a contact hole according to this invention is to conduct an oxidizing operation by a wet etching treatment. An effect of obtaining a low contact resistivity through the hole through an oxidizing operation with better oxidizing uniformity and high throughput due to low price facility or material cost.

The material of the first electrode line is one member selected from a group comprising chrome and molybdenum, the material of the insulating film is one member selected from a group comprising silicon nitride or silicon oxide, and the material of the second electrode line is one member selected from a group comprising chrome, aluminum, molybdenum and indium tin oxide, with an effect that the first electrode line can be applicable even to an active matrix circuit to be used in LCD and ELD, and to the various types of the semiconductor devices.

It should be understood that the apparatus and methods which have been shown and described herein are illustrative of the invention and are not intended to be limitative thereof. Clearly, those skilled in the art may conceive of variations or modifications to the invention. However, any such variations or modifications which falls within the purview of this description are intended to be included therein as well. The scope of the invention is limited only by the claims appended hereto.

What is claimed is:

1. A method of providing a contact hole comprising steps of:

(a) depositing a first conductive film on a substrate and patterning said first conductive film to form a first electrode line, (b) depositing an insulating film on said first electrode line and said substrate, (c) forming a contact hole in said insulating film over a top surface of said first electrode line, and (d) depositing a second conductive film on said insulating film and said contact hole and patterning said second conductive film to form a second electrode line, wherein a surface of said first conductive film is subjected to an oxidizing operation in step (a) so that a contact resistance of said contact hole is lowered.

2. The method of providing a contact hole of claim 1, wherein in said step (a) when said first conductive film is patterned, a surface of said first conductive film is subjected to oxidizing operation before applying a photoresist on said first conductive film.

3. The method of providing a contact hole of claim 2, wherein said oxidizing operation is ultraviolet light treatment in which an ultraviolet light is irradiated under a condition of oxidizing atmosphere.

4. The method of providing a contact hole of claim 3, wherein said ultraviolet light treatment is performed wherein a wavelength of said ultraviolet light is in a range of 180 nm to 300 nm;

wherein an output of said ultraviolet light is in a range of 0.05 W/cm$^2$ to 0.5 W/cm$^2$ where a distance from a light source of said ultraviolet light to said surface of said first conductive film is 1 mm;

wherein a duration of irradiating said ultraviolet light is in a range of 1 minute to 5 minutes; and wherein a temperature of an atmosphere when said ultraviolet light is irradiated is in a range of 100° C. to 200° C.

5. The method of providing a contact hole of claim 2, wherein said oxidizing operation is oxygen plasma treatment wherein oxygen plasma is generated and said surface of said first conductive film is exposed to an atmosphere of said oxygen plasma.

6. The method of providing a contact hole of claim 5, wherein said oxygen plasma treatment is performed wherein a radio frequency power density generating said oxygen plasma is in a range of 0.01 W/cm$^2$ to 10 W/cm$^2$ where a distance from a plasma discharge source to said surface of said first conductive film is 15 mm;

wherein a pressure of said oxygen plasma is in a range of 100 Pa to 200 Pa;

wherein treatment time of oxygen plasma exposure is in a range of 1 minute to 30 minutes; and wherein a temperature of an atmosphere when said oxygen plasma treatment is performed is in a range of 25° C. to 400° C.

7. The method of providing a contact hole of claim 2, wherein said oxidizing operation is wet etching treatment.

8. The method of providing a contact hole of claim 7, wherein said wet etching treatment is performed wherein an etchant for said wet etching treatment is at least one member selected from a group of nitric acid, perchloric acid, hydrogen peroxide, potassium permanganate and ammonium cerium sulfate;

wherein a temperature of said etchant is in a range of 20° C. to 80° C.; and wherein a duration of said wet etching is in a range of 1 minute to 30 minutes.

9. The method of providing a contact hole of claim 1, wherein in said step (a) said first electrode line is provided by patterning said first conductive film and a surface of said first electrode line is subjected to oxidizing operation.

10. The method of providing a contact hole of claim 9, wherein said oxidizing operation is ultraviolet light treatment in which an ultraviolet light is irradiated under a condition of oxidizing atmosphere.

11. The method of providing a contact hole of claim 10, wherein said ultraviolet light treatment is performed wherein a wavelength of said ultraviolet light is in a range of 180 nm to 300 nm;

wherein an output of said ultraviolet light is in a range of 0.05 W/cm$^2$ to 0.5 W/cm$^2$ where a distance from a light source of said ultraviolet light to said surface of said first conductive film is 1 mm;

wherein a duration of irradiating said ultraviolet light is in a range of 1 minute to 5 minutes; and wherein a temperature of an atmosphere when said ultraviolet light is irradiated is in a range of 100° C. to 200° C.

12. The method of providing a contact hole of claim 9, wherein said oxidizing operation is oxygen plasma treatment wherein oxygen plasma is generated and said surface of said first conductive film is exposed to an atmosphere of said oxygen plasma.

13. The method of providing a contact hole of claim 12, wherein said oxygen plasma treatment is performed wherein a radio frequency power density generating said oxygen plasma is in a range of 0.01 W/cm$^2$ to 10 W/cm$^2$ where a distance from a plasma discharge source to said surface of said first conductive film is 15 mm;

wherein a pressure of said oxygen plasma is in a range of 100 Pa to 200 Pa;

wherein treatment time of oxygen plasma exposure is in a range of 1 minute to 30 minutes; and a temperature of an atmosphere when said oxygen plasma treatment is performed is in a range of 25° C. to 400° C.

14. The method of providing a contact hole of claim 9, wherein said oxidizing operation is wet etching treatment.

15. The method of providing a contact hole of claim 14, wherein said wet etching treatment is performed wherein an etchant for said wet etching treatment is at least one member selected from a group of nitric acid, perchloric acid, hydrogen peroxide, potassium permanganate and ammonium cerium sulfate;

wherein a temperature of said etchant is in a range of 20° C. to 80° C.; and wherein a duration of said wet etching is in a range of 1 minute to 30 minutes.

16. The method of providing a contact hole of claim 1, wherein said first electrode line is made of one member selected from a group of chrominum and molybdenum;

wherein a material of said insulating film is one member selected from a group of silicon nitride and silicon oxide; and wherein a material of said second electrode line is one member selected from a group of chrome, aluminum alloy, molybdenum alloy and indium tin oxide.

* * * * *